(12) United States Patent
Kant

(10) Patent No.: US 6,316,301 B1
(45) Date of Patent: Nov. 13, 2001

(54) METHOD FOR SIZING PMOS PULL-UP DEVICES

(75) Inventor: Shree Kant, Fremont, CA (US)

(73) Assignee: Sun Microsystems, Inc., Palo Alto, CA (US)

(*) Notice: Subject to any disclaimer, the term of this patent is extended or adjusted under 35 U.S.C. 154(b) by 0 days.

(21) Appl. No.: 09/520,921

(22) Filed: Mar. 8, 2000

(51) Int. Cl.$^7$ .................... H01L 21/336; H01L 21/8234
(52) U.S. Cl. .................. 438/197; 438/197; 438/199; 438/202; 438/203; 257/288; 257/369
(58) Field of Search .................. 438/197–233; 257/288, 369; 327/307–40; 326/1–40

(56) References Cited

U.S. PATENT DOCUMENTS 5,880,967 * 3/1999 Jyu et al. .................. 364/489

OTHER PUBLICATIONS

Pham et al. "Simple 6–Bit Neural–based A/D converter using CMOS inverters" 1996 IEEE 0–7803–3073–0/96 p. 357–360.*

* cited by examiner

Primary Examiner—Matthew Smith
Assistant Examiner—Granvill D. Lee
(74) Attorney, Agent, or Firm—William L. Paradice, III

(57) ABSTRACT

In a logic circuit having PMOS pull-up devices and NMOS pull-down devices, the PMOS pull-up devices are sized relative to the NMOS pull-down devices according to the number of transistors that simultaneously turn on. In one embodiment, the PMOS transistor width is determined by multiplying the effective NMOS transistor width by a pre-determined factor indicative of a current carrying ratio between one of the PMOS pull-up transistors and one of the NMOS pull-down transistors and dividing by the number of PMOS pull-up transistors that simultaneously turn on to charge the output node high. Where the PMOS pull-up devices are parallel-connected, the NMOS transistor width is divided by the number of NMOS transistors.

13 Claims, 4 Drawing Sheets

METHOD FOR SIZING PMOS PULL-UP DEVICES

BACKGROUND

1. Field of Invention

This invention relates generally to CMOS logic and specifically to minimizing silicon area of PMOS pull-up devices in static logic.

2. Description of Related Art

CMOS logic devices typically include one or more PMOS pull-up transistors connected between a voltage supply and an output node and one or more NMOS pull-down transistors connected between the output node and ground potential. Since the mobility of electrons is greater than the mobility of holes, an NMOS transistor is able to conduct a greater current than a PMOS transistor of the same size. Consequently, in CMOS logic devices, the PMOS pull-up transistors are typically sized much larger than their corresponding NMOS pull-down transistors so that the charge path formed by the PMOS pull-up transistors and the discharge path formed by the NMOS pull-down transistors have equal drive strengths. Maintaining equal drive strengths for the charge and discharge paths is necessary to achieve equal charging and discharging rates of the output node, which in turn provides balanced logic transitions.

A well-known sizing factor used to maintain equal drive strength between a PMOS pull-up transistor and an NMOS pull-down transistor is Beta ($\beta$), which is equal the mobility of electrons divided by the mobility of holes. This relationship may be expressed as $\beta \cong \mu_n/\mu_p$, where $\mu_n$ is the mobility of electrons, and $\mu_p$ is the mobility of holes. Since the effective drive strength of a transistor is proportional to its width W, the width $W_p$ of a PMOS transistor which provides the same drive strength as an NMOS transistor of width $W_n$ is given by $W_p = \beta W_n$.

FIG. 1 shows a conventional CMOS inverter 10 having a PMOS pull-up transistor 11 connected between a supply voltage $V_{DD}$ and an output node 12, and having an NMOS pull-down transistor 13 connected between the output node 12 and ground potential. The CMOS inverter inverts an input signal provided to the gates of transistors 11 and 13 to generate an output signal B at output node 12. When signal A is logic low, the PMOS pull-up transistor turns on and charges the output node 12 toward $V_{DD}$, while the NMOS pull-down transistor 13 turns off and isolates output node 12 from ground potential. When signal A is logic high, the NMOS pull-down transistor 13 turns on and discharges output node 12 toward ground potential, while the PMOS pull-up transistor 11 turns off and isolates output node 12 from $V_{DD}$. Since the PMOS transistor 11 is the only pull-up device, the effective drive strength $S_p$ of the pull-up path is determined by the width $W_p$ of the pull-up transistor 11. Similarly, since the NMOS transistor 13 is the only pull-down device, the effective drive strength of the pull-down path is determined by the width $W_n$ of the pull-down transistor 13. Thus, to maintain equal drive strengths $S_p$ and Sn for the respective charge and discharge paths in the CMOS inverter 10, the width of the PMOS pull-up transistor $W_p$ should be equal to the width of the NMOS pull-down transistor $W_n$ times Beta, i.e., $W_p = \beta W_n$. For example, if $\beta = 2$, the width $W_p$ of the PMOS pull-up transistor 11 must be twice the width $W_n$ of the NMOS pull-down transistor 13 to achieve equal drive strengths for the charge and discharge paths.

FIG. 2 shows a conventional NAND gate 20 having two PMOS pull-up transistors 21 and 22 connected in parallel between $V_{DD}$ and an output node 23, and two NMOS pull-down transistors 24 and 25 connected in series between the output node 23 and ground potential. A first input signal A0 is provided to the respective gates of the transistors 21 and 24, and a second input signal A1 is provided to the respective gates of transistors 22 and 25. If either of the input signals A0 or A1 is logic low, the corresponding PMOS pull-up transistor 21 and/or 22 turns on and charges the output node 23 toward $V_{DD}$, thereby driving the output signal B to logic high. Since only one of the input signals A0 or A1 must be logic low to drive output signal B to logic high, sometimes only one of the PMOS pull-up transistors 21 and 22 turns on to charge the output node 23 toward $V_{DD}$. Thus, the effective drive strength $S_p$ of the charge path is equal to that of one of the PMOS pull-up transistors 21 or 21, i.e., $S_p \cong W_p$.

Both input signals A0 and A1 must be logic high in order to discharge the output node 23 toward ground potential through series-connected NMOS pull-down transistors 24 and 25. Since the resistance of two series-connected transistors is twice that of a single transistor, the effective drive strength of the discharge path through NMOS pull-down transistors 24 and 25 is about one-half the effective drive strength of a single NMOS transistor, i.e., $S_n \cong W_n/2$. Thus, in order to maintain equal drive strengths for the charge and discharge paths of the NAND gate 20, the width of each of the PMOS pull-up transistors 21 and 22 is sized by multiplying the effective NMOS transistor width times Beta, i.e., $W_p = \beta W_n/2$.

It is always desirable to reduce the size of a circuit such as, for instance, a CMOS logic device, since any reduction in circuit size typically reduces manufacturing costs and power consumption. Further, reducing the silicon area of a circuit advantageously allows for the circuit to be more easily fabricated using smaller technologies.

While it is desirable to reduce transistor size in order to conserve silicon area, the proper ratio between PMOS and NMOS devices in logic devices must be maintained in order to preserve the balance of the circuit. Otherwise, one input level may overpower the other input level, which in turn could result in erroneous data. Thus, it is desirable to reduce transistor size without sacrificing performance or upsetting the balance of current-carrying capability between PMOS pull-up and NMOS pull-down devices.

SUMMARY

A method is disclosed that allows for a reduction in silicon area in applications where a number of input signals simultaneously transition to the same logic state. In accordance with one embodiment of the present invention, the PMOS pull-up devices of a logic circuit are sized relative to the NMOS pull-down devices therein according to the number of the PMOS pull-up devices that simultaneously turn on. For example, in one embodiment, the PMOS pull-up transistor width is determined by multiplying the NMOS pull-down transistor width by a predetermined factor indicative of a current carrying ratio between one of the PMOS pull-up transistors and one of the NMOS pull-down transistors and then dividing by the number of PMOS pull-up transistors that simultaneously turn on to charge the output node high. In one embodiment, the width $W_p$ of each parallel-connected PMOS pull-up device sized relative to the width $W_n$ of each series-connected NMOS pull-down device may be expressed as $W_p = W_n(\beta/kN)$, where $\beta$ is the current carrying ratio between one of the PMOS pull-up transistors and one of the NMOS pull-down transistors, k is the number of PMOS devices that simultaneously turn on, and N is the number of NMOS devices. In another embodiment, the width $W_p$ of each series-connected PMOS pull-up device sized relative to the width $W_n$ of each parallel-connected NMOS pull-down device may be expressed as $W_p=W_n(\beta N/k)$. By factoring the number of PMOS pull-up devices that simultaneously turn on into sizing of the PMOS pull-up devices, the present invention may reduce silicon area of logic devices having PMOS pull-up transistors and NMOS pull-down transistors.

BRIEF DESCRIPTION OF THE DRAWINGS

Like reference numerals refer to corresponding parts throughout the drawing figures.

DETAILED DESCRIPTION

Embodiments of the present invention are discussed below in the context of static logic being driven by dynamic flip-flops for simplicity only. It is to be understood that embodiments of the present invention are useful in re-sizing PMOS pull-up devices for any application having a number of input signals that simultaneously transition to the same logic state. Accordingly, the present invention is not to be construed as limited to specific examples described herein but rather includes within its scope all embodiments defined by the appended claims.

Figure 3:
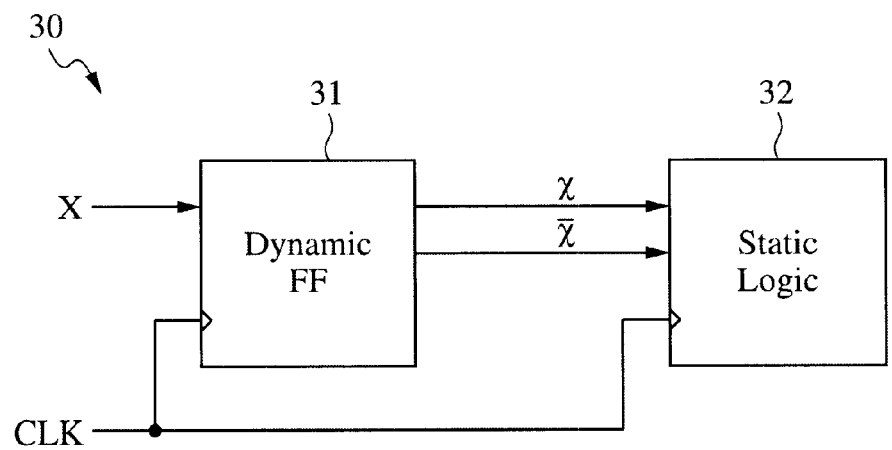
FIG. 3 is a block diagram of a dynamic flip-flop driving static logic gates sized in accordance with one embodiment of the present invention.
Figure 4:
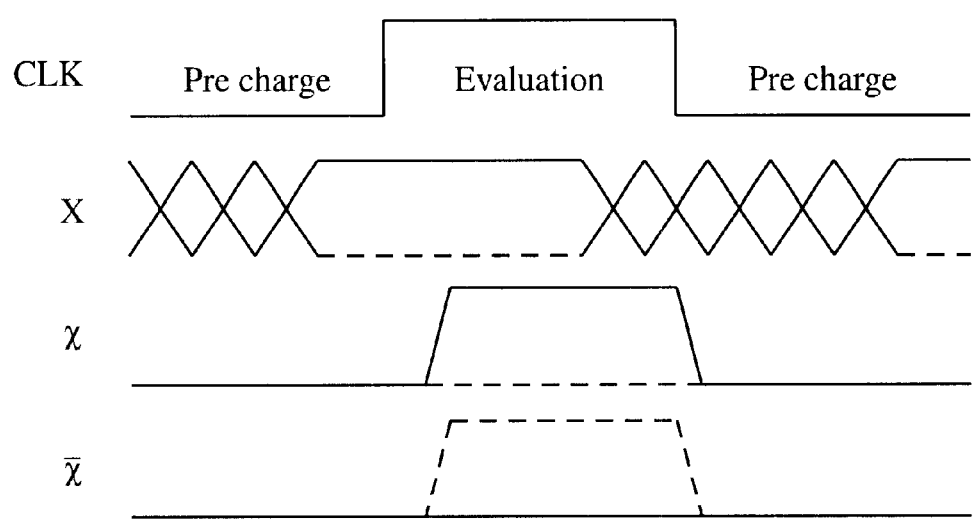
FIG. 4 is a timing diagram illustrating the pre-charge and evaluation phases of the dynamic flip-flop of FIG. 3.

FIG. 3 is a block diagram of a system 30 including a dynamic flip-flop 31 and a static logic circuit 32 having transistors sized in accordance with the present invention. The dynamic flip-flop 31 is well-known and may be, for example, of the type disclosed in U.S. Pat. No. 5,825,224 issued to Klass et al on Oct. 20, 1998 and assigned to the assignee of the present invention, incorporated by reference herein, although other dynamic flip-flops may be used. The dynamic flip-flop 31 has an input terminal coupled to receive an input signal X, and output terminals to provide complementary output signals x and $\bar{x}$ to the logic circuit 32. A clock signal CLK provided to respective clock input terminals of the dynamic flip-flop 31 and logic circuit 32 defines alternating pre-charge and evaluation phases for the system 30. During the pre-charge phase, the dynamic flip-flop 31 drives output signals x and $\bar{x}$ to a first logic state, e.g., logic low, and during the evaluation phase, the dynamic flip-flop 31 samples the input signal X and, in response thereto, drives either output signal x or its complement $\bar{x}$ to a second logic state, e.g., logic high, as illustrated, for instance, in FIG. 4.

Although shown in FIG. 3 as receiving a single input signal x and its complement $\bar{x}$, in actual embodiments the logic circuit 32 may receive a plurality of input signals (and/or corresponding complementary input signals), whereby each input signal is driven by a corresponding dynamic flip-flop 31 to ensure compatibility with dynamic logic, e.g., to ensure that the input signals are driven to the logic low state during each pre-charge phase. For example, FIG. 5 shows a plurality of dynamic flip-flops 31 connected between a respective plurality of input signals X(0)–X(n) and the logic circuit 32, where each dynamic flip-flop 31 receives a corresponding one of the input signals X(0)–X(n) and, in response thereto, drives respective complementary signals x(0)–x(n) and $\bar{x}(0)$–$\bar{x}(n)$ in the manner described above with respect to FIG. 4.

Logic circuit 32 includes a number of suitable logic gates such as, for instance, AND gates, NAND gates, OR gates, NOR gates, XOR gates, XNOR gates, and so on. Since the input signals to the logic circuit 32 are driven to logic low during each pre-charge phase, the PMOS pull-up devices that form charge paths for gates within the logic circuit 32 may be sized in accordance with the present invention. Specifically, since all input signals simultaneously transition to logic low during each pre-charge phase, all PMOS pull-up devices simultaneously turn on to charge their respective output nodes toward a supply voltage during each pre-charge phase. Thus, each PMOS pull-up device connected in parallel between the supply voltage and the output node always participates in charging the output node toward the supply voltage. As a result, the effective drive strength for the charge path is equal to the sum of the individual drive strengths of all the PMOS pull-up devices, rather than equal to the drive strength of just one of the pull-up devices. This allows the size of each such PMOS pull-up device to be reduced while maintaining equal drive strengths between the PMOS charge path and NMOS discharge path.

Figure 5:
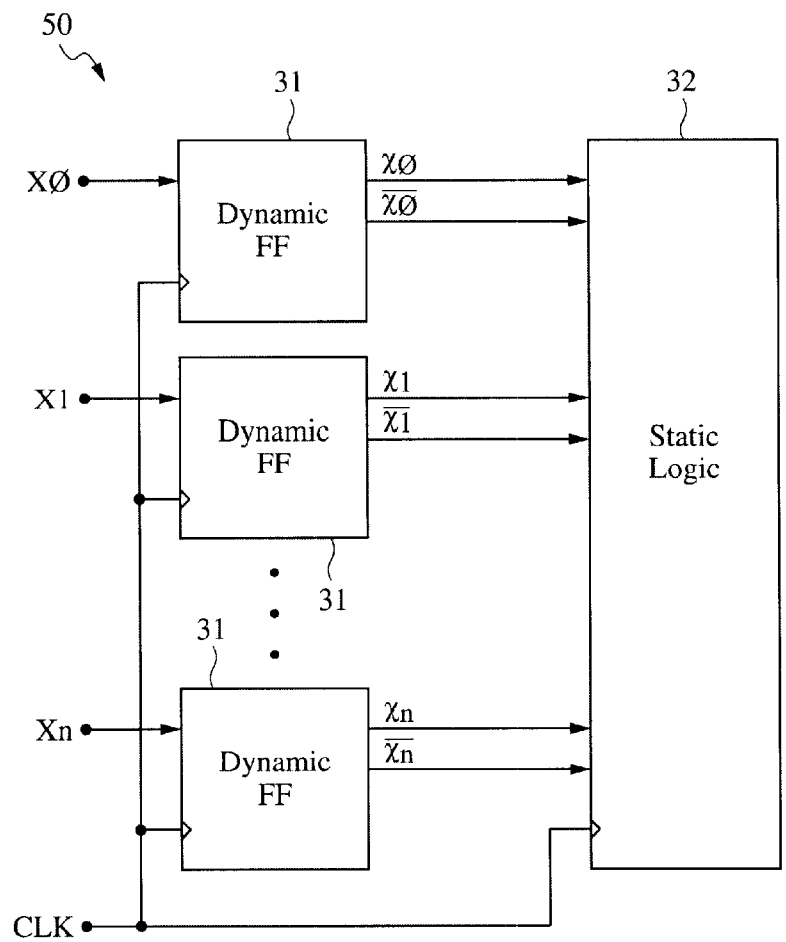
FIG. 5 is a block diagram of a plurality of dynamic flip-flops driving a multiple-input embodiment of the static logic circuit of FIG. 3.
Figure 6:
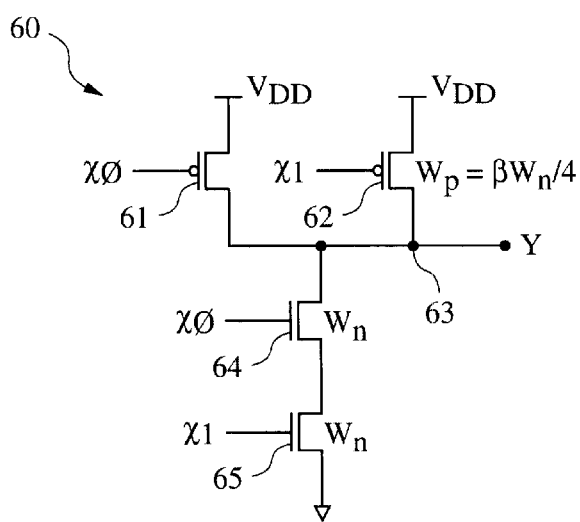
FIG. 6 is a circuit diagram of a 2-input NAND gate having PMOS and NMOS transistors sized in accordance with one embodiment of the present invention.

For example, FIG. 6 shows a 2-input NAND gate 60 that is one embodiment of the logic circuit 32 of FIG. 5 having PMOS pull-up and NMOS pull-down devices sized in accordance with the present invention. The NAND gate 60 includes PMOS pull-up transistors 61 and 62 connected in parallel between the output node 63 and the supply voltage $V_{DD}$, and NMOS pull-down transistors 64 and 65 connected in series between output node 63 and ground potential. The input signals x0 and x1 are dynamic signals provided by corresponding dynamic flip-flops (not shown in FIG. 5 for simplicity), and are thus driven to logic low during the pre-charge phase of the clock cycle. NAND gate 60 is a static logic circuit, and does not receive the complementary input signals $\overline{x0}$–$\overline{xn}$ shown in FIG. 5.

Figure 1:
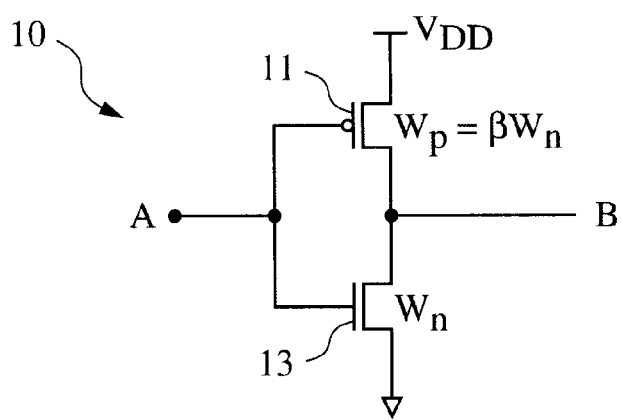
FIG. 1 is a circuit diagram of a conventional CMOS inverter.
Figure 2:
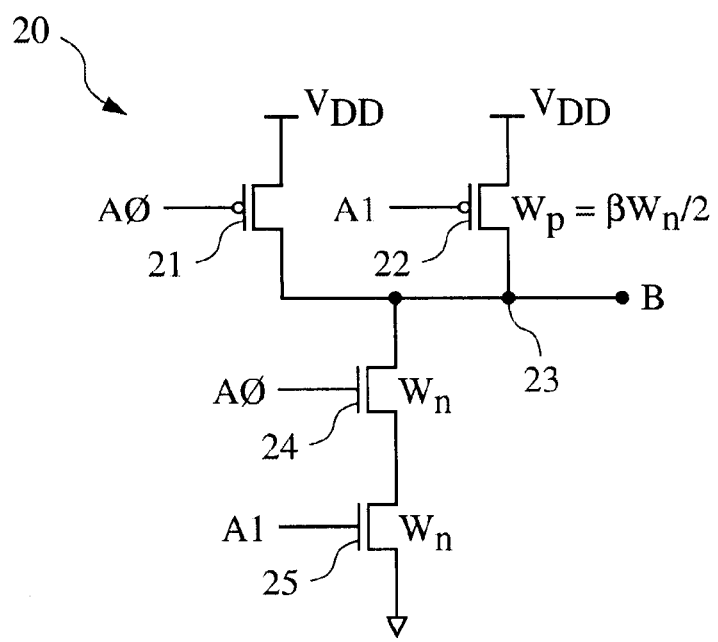
FIG. 2 is a circuit diagram of a 2-input NAND gate having PMOS and NMOS transistors sized in a conventional manner.

Since the NMOS transistors 64 and 65 are connected in series between output node 63 and ground potential, the total resistance of the discharge path is approximately twice the resistance of each NMOS transistor 64 and 65. Accordingly, the effective drive strength $S_n$ of the NMOS pull-down path is approximately one-half that of a single NMOS transistor, i.e., $S_n \cong W_n/2$. However, unlike the prior art NAND gate 20 of FIG. 2, the PMOS pull-up transistors 61 and 62 of the NAND gate 60 simultaneously turn on during each pre-charge phase since the dynamic input signals x0 and x1 are driven to the logic low state during each pre-charge phase. Hence, the effective drive strength for the charge path is the sum of the drive strengths of the PMOS transistors 61 and 62, i.e., $S_p \cong 2W_p$. Therefore, in order to maintain equal drive strengths for the charge and discharge paths, where $S_p \cong 2W_p = S_n \cong W_n/2$, the width of each PMOS transistor 61 and 62 is given by $W_p = \beta W_n/4$. Accordingly, the present invention allows the size of PMOS pull-up transistors 61 and 62 of the logic gate 60 to be approximately one-half that of the PMOS pull-up transistors of the prior art NAND gate 20 of FIG. 2, for which the PMOS pull-up transistors 21 and 22 are sized as $W_p = \beta W_n/2$.

Figure 7:
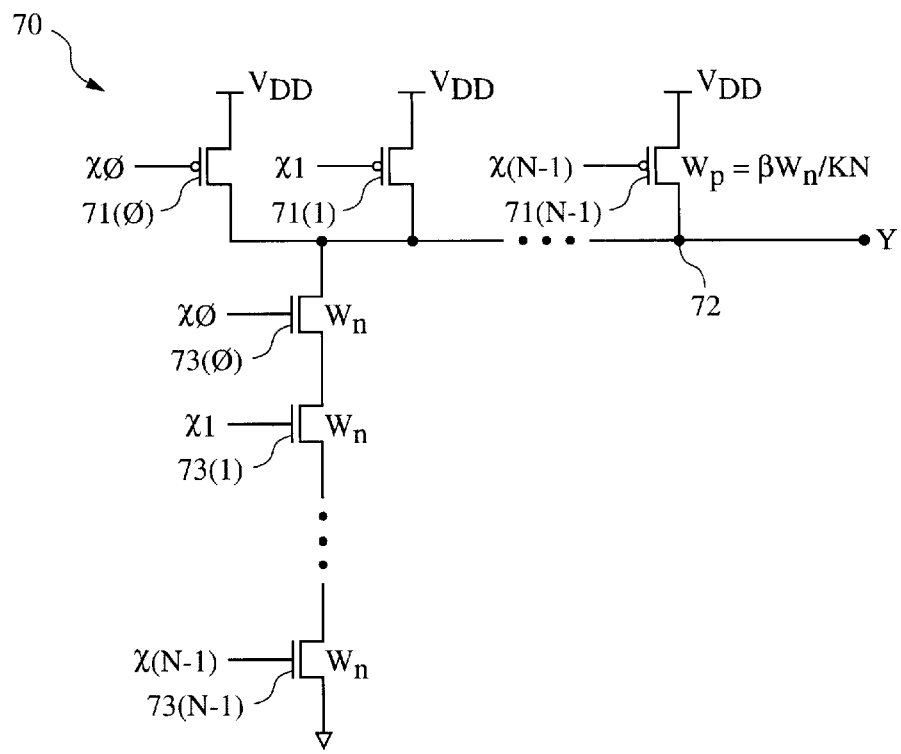
FIG. 7 is a circuit diagram of an N-input NAND gate having PMOS and NMOS transistors sized in accordance with another embodiment of the present invention.

The sizing of parallel-connected PMOS pull-up devices according to present embodiments may be more generally expressed as $W_p = \beta W_n/Nk$, where N is the number of NMOS transistors connected in series between the output node and ground potential, and k is the number of PMOS pull-up devices that simultaneously turn on to charge the output node. For example, FIG. 7 shows an N-input NAND gate 70 having N PMOS pull-up transistors 71(0)–71(N–1) connected in parallel between the output node 72 and the supply voltage $V_{DD}$, and N NMOS pull-down transistors 73(0)–73(N–1) connected in series between the output node 72 and ground potential. The PMOS pull-up transistors 71(0)–71(N–1) and NMOS pull-down transistors 73(0)73(N–1) have respective gates coupled to receive corresponding input signals $x(0)$–$x(N-1)$. The effective drive strength of the discharge path to ground potential through the N NMOS transistors 73(0)–73(N–1) is inversely proportional to the number of series-connected NMOS pull-down transistors between output node 72 and ground potential, i.e., $S_n \cong W_n/N$. The effective drive strength of the charge path to $V_{DD}$ via the parallel-connected PMOS transistors is proportional to the number of PMOS pull-up transistors 71(0)–71(N–1) which turn on simultaneously, i.e., $S_p \cong kW_p$. Thus, sizing the PMOS pull-up transistors to a width of $W_p = \beta W_n/Nk$ facilitates equal drive strengths for the charge and discharge paths. Note here that k may be any integer greater than 1 and less than or equal to N, and therefore the present invention is also applicable where some but not all of the input signals simultaneously transition to the same logic state.

Sizing schemes in accordance with the present invention are in contrast to conventional sizing schemes which size the PMOS pull-up transistors as $W_p = \beta W_n/N$. Accordingly, sizing PMOS pull-up transistors in accordance with the present invention allows for PMOS pull-up transistors to be reduced by the factor k while preserving equal drive strengths for the charge and discharge paths. Thus, for instance, PMOS pull-up device width accordance with the present invention by a factor of 4 over prior art NAND gates.

Figure 8:
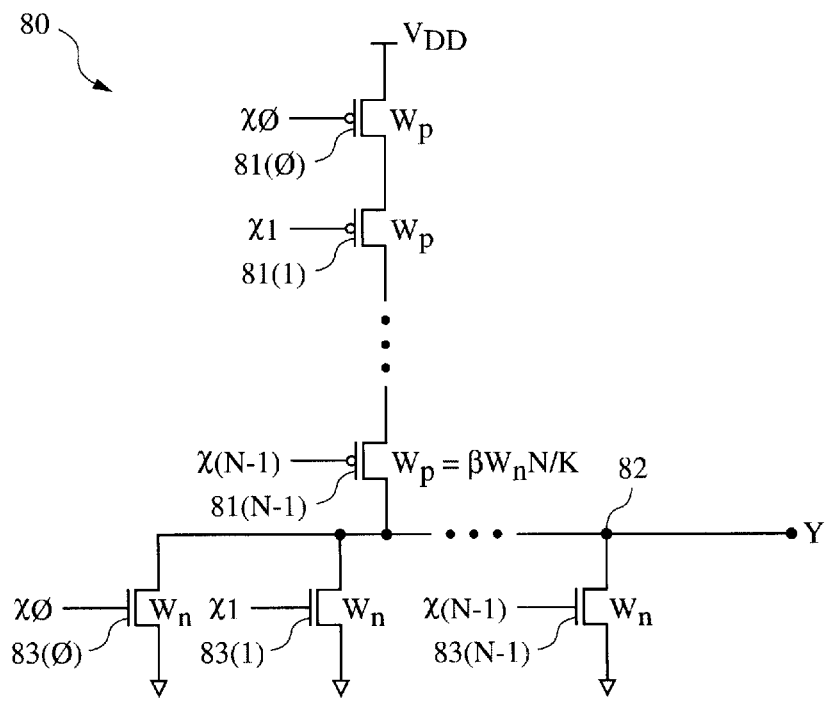
FIG. 8 is a circuit diagram of an N-input NOR gate having PMOS and NMOS transistors sized in accordance with yet another embodiment of the present invention.

The present invention is also applicable to logic circuits which have a number of NMOS pull-down transistors connected in parallel between the output node and ground potential and a number of PMOS pull-up devices connected in series between the output node and the supply voltage $V_{DD}$. For example, FIG. 8 shows an N-input NOR gate 80 having N PMOS pull-up transistors 81(0)–81(N–1) connected in series between an output node 82 and $V_{DD}$ and N NMOS pull-down transistors 83(0)–83(N–1) connected in parallel between output node 82 and ground potential. The PMOS pull-up transistors 81(0)–81(N–1) and NMOS pull-down transistors 83(0)–83(N–1) have respective gates coupled to receive corresponding input signals $x(0)$–$x(N-1)$, as shown in FIG. 8. The effective drive strength of the charge path to $V_{DD}$ through the N PMOS transistors 81(0)–81(N–1) is inversely proportional to the number of series-connected PMOS pull-up transistors between output node 82 and $V_{DD}$, i.e., $S_p \cong W_p/N$. The effective drive strength of the discharge path to ground potential via the parallel-connected NMOS transistors is proportional to the number of NMOS pull-down transistors 83(0)–83(N) which turn on simultaneously, i.e., $S_n \cong kW_n$. Thus, sizing the PMOS pull-up transistors to a width of $W_p = N\beta W_n/k$ facilitates equal drive strengths for the charge and discharge paths.

The down-sizing of PMOS pull-up devices facilitated by the present invention may result in significant savings in silicon area and power consumption, especially in applications having large arrays of logic gates that are driven by dynamic flip-flops or by any other circuit that simultaneously switches a number of input signals to the same logic state. For example, since row decoders used to decode addresses for memory devices such as SRAM and register files typically include hundreds or even thousands of 2-input and/or 3-input logic gates, reducing the size of PMOS pull-up devices used in such row decoders by respective factors of 2 and/or 3 as described above in accordance with the present invention can significantly reduce the silicon area occupied by such row decoders.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

I claim:

1. A method of sizing each of a plurality of PMOS pull-up transistors relative to the size of each of a plurality of NMOS pull-down transistors in a logic circuit, wherein respective pairs of the plurality of PMOS pull-up and NMOS pull-down transistors may receive corresponding ones of a plurality of input signals, the method comprising:

selecting an NMOS transistor width;

determining an effective NMOS transistor width from the NMOS transistor width;

multiplying the effective NMOS transistor width by a predetermined factor indicative of a current carrying capacity ratio between one of the PMOS pull-up transistors and one of the NMOS pull-down transistors;

dividing a result of the multiplying step by the number of parallel-connected transistors that simultaneously turn on to generate a PMOS transistor width; and sizing each of the PMOS pull-up transistors to the PMOS transistor width.

2. The method of claim 1, wherein each of the PMOS pull-up transistors is connected in parallel between a voltage supply and an output node, and each of the NMOS pull-down transistors is connected in series between the output node and ground potential.

3. The method of claim 2, wherein the effective NMOS transistor width is equal to the NMOS transistor width divided by the number of NMOS pull-down transistors.

4. The method of claim 1, wherein each of the PMOS pull-up transistors is connected in series between a voltage supply and an output node, and each of the NMOS pull-down transistors is connected in parallel between the output node and ground potential.

5. The method of claim 4, wherein the effective NMOS transistor width is equal to the NMOS transistor width multiplied by the number of NMOS pull-down transistors.

6. A method of minimizing silicon area of a selected circuit having a plurality of input signals received by a respective plurality of PMOS pull-up transistors and by a respective plurality of NMOS pull-down transistors, the method comprising:

selecting an NMOS transistor width;

determining an effective NMOS transistor width from the NMOS transistor width;

multiplying the effective NMOS transistor width by a predetermined factor indicative of a current carrying capacity ratio between one of the PMOS pull-up transistors and one of the NMOS pull-down transistors;

multiplying a result of the multiplying step by the number of input signals that simultaneously transition to the same logic state to generate a PMOS transistor width; and sizing each of the PMOS pull-up transistors to the PMOS transistor width.

7. The method of claim 6, wherein each of the PMOS pull-up transistors is connected in parallel between a voltage supply and an output node, and each of the NMOS pull-down transistors is connected in series between the output node and ground potential.

8. The method of claim 7, wherein the effective NMOS transistor width is equal to the NMOS transistor width divided by the number of NMOS pull-down transistors.

9. The method of claim 6, wherein each of the PMOS pull-up transistors is connected in series between a voltage supply and an output node, and each of the NMOS pull-down transistors is connected in parallel between the output node and ground potential.

10. The method of claim 9, wherein the effective NMOS transistor width is equal to the NMOS transistor width multiplied by the number of NMOS pull-down transistors.

11. A circuit comprising:

a plurality of PMOS pull-up transistors connected between a voltage supply and an output node, each having a gate coupled to receive a corresponding one of a plurality of input signals, where each PMOS pull-up transistor is of a first width;

a plurality of NMOS pull-down transistors connected between the output node and ground potential, each having a gate coupled to receive a corresponding one of the plurality of input signals, where each NMOS pull-down transistor is of a second width, wherein the first width is equal to the second width multiplied by a factor indicative of a current carrying ratio between one of the PMOS pull-up transistors and one of the NMOS pull-down transistors and divided by the number of input signals that simultaneously transition to the same logic state.

12. The circuit of claim 11, wherein the PMOS pull-up transistors are connected in parallel between the output node and the supply voltage, and the NMOS pull-down transistors are connected in series between the output node and ground potential.

13. The circuit of claim 11, wherein the PMOS pull-up transistors are connected in series between the output node and the supply voltage, and the NMOS pull-down transistors are connected in parallel between the output node and ground potential.

* * * * *